(12) United States Patent
Saegrov

(10) Patent No.: US 8,140,117 B2
(45) Date of Patent: Mar. 20, 2012

(54) CIRCUIT BOARD WITH ADAPTIVE, ELECTROMAGNETIC COUPLER

(75) Inventor: Atle Saegrov, Trondheim (NO)

(73) Assignee: Radionor Communications AS, Trondheim (NO)

( * ) Notice: Subject to any disclaimer, the term of this patent is extended or adjusted under 35 U.S.C. 154(b) by 648 days.

(21) Appl. No.: 11/573,400

(22) PCT Filed: Aug. 10, 2005

(86) PCT No.: PCT/NO2005/000288
§ 371 (c)(1),
(2), (4) Date: Apr. 10, 2007

(87) PCT Pub. No.: WO2006/016816
PCT Pub. Date: Feb. 16, 2006

(65) Prior Publication Data
US 2008/0039137 A1    Feb. 14, 2008

(30) Foreign Application Priority Data
Aug. 10, 2004  (NO) .................................. 20043357

(51) Int. Cl.
*H04B 1/38*    (2006.01)
(52) U.S. Cl. ..................... 455/558; 455/414; 379/433.09
(58) Field of Classification Search .................. 455/558, 455/410, 411, 414.1; 379/433.09
See application file for complete search history.

(56) References Cited

U.S. PATENT DOCUMENTS
6,240,301 B1 *  5/2001 Phillips ........................ 455/558
6,342,869 B1 *  1/2002 Edvardsson et al. .......... 343/841

FOREIGN PATENT DOCUMENTS
EP   1387435        2/2004
EP   1387435 A1 *  2/2004
* cited by examiner

*Primary Examiner* — Dominic E Rego
(74) *Attorney, Agent, or Firm* — Christian Abel

(57) ABSTRACT

The invention relates to a circuit board such as an SIM card for use in an apparatus such as a mobile telephone. The circuit board comprises an adaptive electromagnetic coupler, and is arranged to find the different resonance modes for the surrounding metallic structure of the apparatus, which may be of arbitrary geometry and character. The different resonance modes and resonance frequencies are influenced, and the resonance mode that gives the most efficient radiation of electromagnetic energy is selected on the desired frequency. The circuit board can be adapted to combined transmitters and receivers by the ability to put it into transmission or receiving mode with a selector switch. By connecting electromagnetic energy to the surrounding metallic structure, the electromagnetic coupler can be made small, viewed in connection with the frequency employed. This permits it to be designed as a small SIM card. New functionality can be supplied to the existing apparatus by an ordinary SIM card being replaced by an SIM card according to the invention. Additional communication is thereby achieved on other frequencies and protocols than those regularly handled by the apparatus.

24 Claims, 3 Drawing Sheets

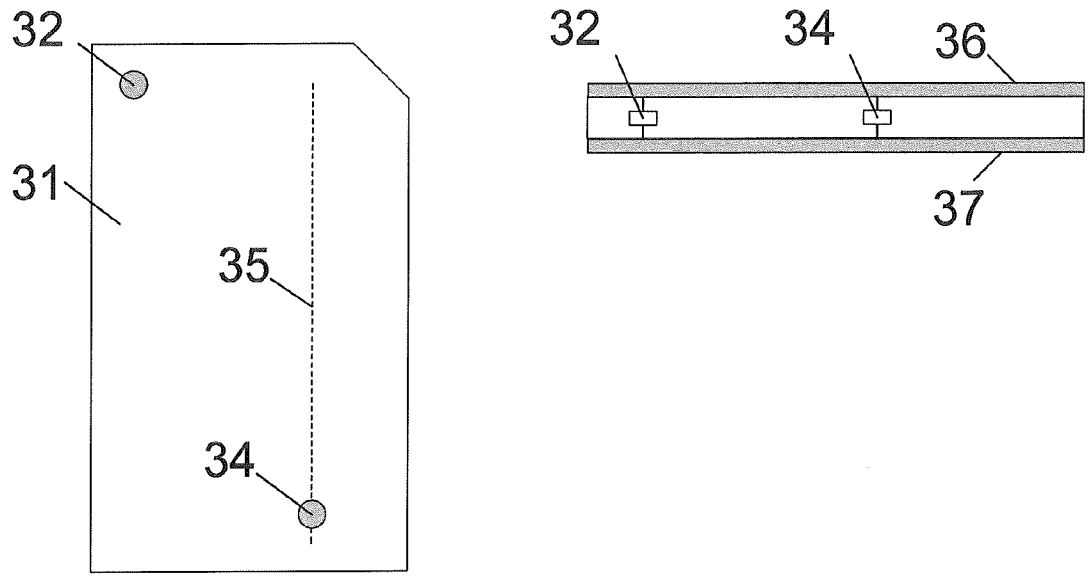
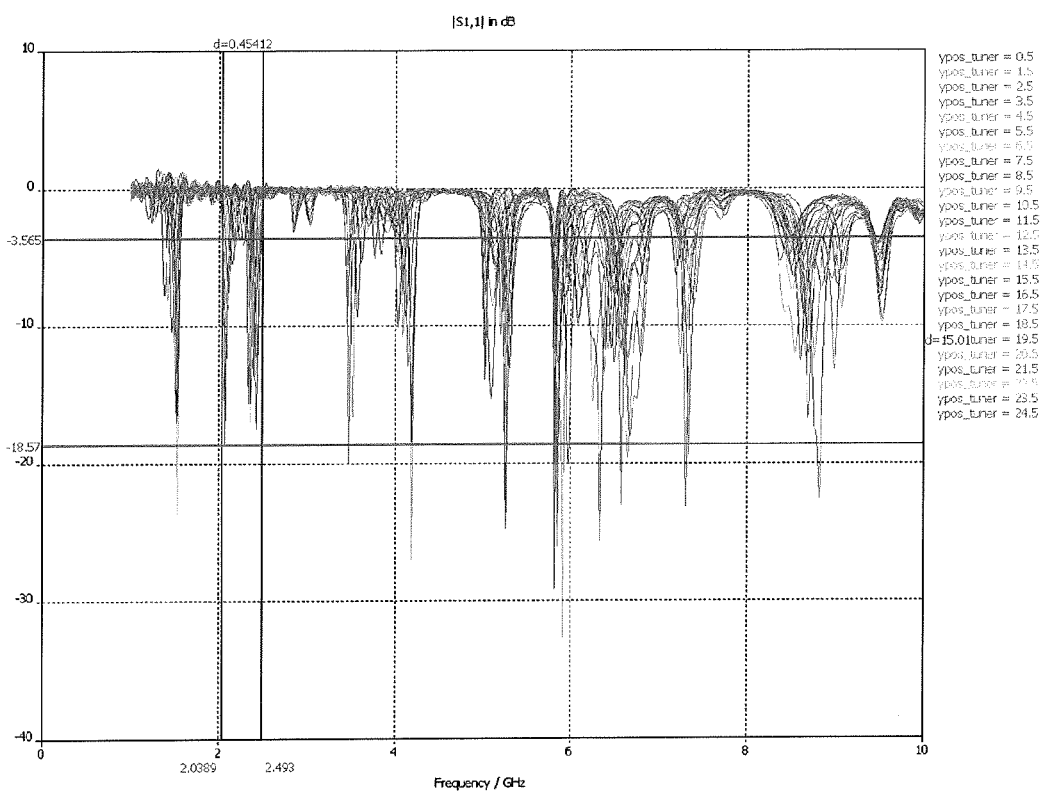
Figure 3
Figure 4

CIRCUIT BOARD WITH ADAPTIVE, ELECTROMAGNETIC COUPLER

TECHNICAL FIELD

The invention relates to circuit boards for mounting in an electronic apparatus, especially small module circuit boards such as SIM cards, Multimedia flash cards, SD cards, CompactFlash cards which during use are inserted in portable electronic equipment such as mobile telephones, PC's or hand-held computers (PDA's). In more specific terms, the invention relates to circuit boards of this kind provided with an electromagnetic coupler or antenna, with the object of permitting wireless communication between the circuit board and an external communication system.

In the following description the term "SIM card" is often used to describe the circuit board containing the electromagnetic coupler or antenna, and the term "mobile telephone" for the apparatus into which the board is inserted. This is done in order to give a preferred example a concrete form, and to make the description easier to read. Other similar types, embodiments and combinations are also covered by this invention.

BACKGROUND OF THE INVENTION

The use of portable electronic equipment, particularly mobile communication equipment has become widespread, resulting in the wish to supply new services employing different radio interfaces and/or protocols. This can be done by putting the functionality into modules such as SIM cards, which are regularly inserted in an apparatus such as a mobile telephone. Additional radio interfaces can thereby be established that fulfil, for example, IEEE WLAN 802.11, IEEE 802.15 (Bluetooth/Zigbee), IEEE 802.16 (WiMax) or similar standards, in addition to the normal functionality of the apparatus. Standards for so-called ISM (Industrial Scientific Medical) frequency band are of special interest, since by using these, extra services can be established on frequency bands where reasonably priced communication equipment is available. This type of integration of new functionality may also be envisaged in existing equipment by means of proprietary frequencies and protocols.

The invention presents a technical solution to the particularly challenging problem of implementing an electromagnetic coupler or antenna that has to be inserted in a unit of small physical dimensions. This was previously solved by inserting reactance elements such as inductors and coils in order to bring the small structure into resonance, but this kind of solution makes the antenna sensitive to the external environment, and any dielectric material or metal structures near the antenna will then influence the resonance frequency, thus making it impossible to obtain an effective radiation from the antenna. In such applications large metallic structures are located close to the antenna—often only 0.1-0.5 mm from the antenna elements. In addition the surrounding metal structure is of arbitrary geometry or shape, since the circuit board has to be arranged so as to be able to be inserted in various types of apparatus—also with a view to future, as yet unknown models of, for example, mobile telephones.

It is therefore a basic premise for the invention that under such conditions it is inappropriate to implement a conventional antenna solution.

THE PRIOR ART

From international patent application U.S. Pat. No. 6,240,301 a technique is known where an SIM card can be inserted with an integrated antenna, thus permitting, e.g., a GSM telephone to be extended to also support communication in other frequency bands and protocols such as PDC (Pacific Digital Cellular). A technique is described where an SIM card is placed in a mobile telephone such as a GSM mobile telephone, where the SIM card contains circuits for communicating on other frequencies than GSM. Communication with the apparatus is conducted by means of the SIM card contact, thereby extending the functionality of the mobile telephone by insertion of this SIM card. The technique indicates that the antenna can be implemented by means of a "patch antenna" or a "bow-tie dipole antenna". The publication therefore indicates no solution to the challenges involved in placing such an antenna inside a surrounding metallic structure, which is often the case when an SIM card is placed in a mobile telephone. Conventional antennas suggested will thus be influenced by the surrounding metallic structures to such an extent that it results in extremely poor radiation efficiency and thereby a short communication range.

SUMMARY OF THE INVENTION

It is an object of the present invention to provide a circuit board, such as an SIM card, for mounting in an electronic apparatus, such as a mobile telephone, where an electromagnetic coupler on the circuit board interacts with a metallic structure in the apparatus, thus permitting the resulting antenna solution to emit and receive electromagnetic signals in an efficient manner.

A special object is to provide a circuit board of such a type that will result in an efficient antenna solution, even though the circuit board is placed in surroundings comprising arbitrary structures, such as metal in plates and batteries, and even though this structure or its electromagnetic resonance characteristics are altered.

It is a further object to provide such a circuit board that will function satisfactorily in a number of different types of apparatus of known and as yet unknown types, where the configuration of the surrounding metallic structure and the location of the transmitter unit may vary.

A further object is to provide such a circuit board of a type which occupies a minimum of space and which permits predetermined conditions for the board's physical dimensions to be fulfilled.

The above objects are achieved according to the invention with a circuit board as indicated in the following patent claim 1. Further objects and advantages are achieved by means of embodiments indicated in the dependent claims.

According to the invention, therefore, a circuit board is provided for mounting in an electronic apparatus, which firstly comprises an electromagnetic coupler, and secondly a controller that is arranged to adapt resonance characteristics of the electromagnetic coupler depending on the resonance characteristics of the apparatus.

According to the invention electromagnetic resonance characteristics are measured or mapped by the apparatus, particularly the surrounding metallic structure in the apparatus. Furthermore, the resonance characteristics of the electromagnetic coupler are adapted depending on the measured resonance characteristics of the apparatus.

The adaptation is preferably implemented by the electromagnetic coupler comprising a first and a second electrically conductive structure on opposite sides of the circuit board, and by means of a number of controllable electrical connections mounted between points on the first and the second conductive structure. The controller is arranged to adapt the electromagnetic coupler's resonance characteristics by supplying signals to these controllable electrical connections. The controller can thereby influence different modes of resonance for the total antenna structure. The connections may comprise reactance or other types of impedance elements in order to influence the resonance frequency.

In order to explain the principles of the invention, it will be advantageous to consider a figurative, simplified, acoustic analogy. In such an analogy the insertion of short circuits may be compared to a guitarist placing his finger on different positions on the neck of the guitar, thus bringing the string into different basic frequency resonances and resonance on harmonic frequencies. According to the invention, moreover, reactances or other impedances may be introduced, which in the acoustic analogy would correspond to turning the tuning pin on the guitar. Since the oscillating electromagnetic structure according to the invention is three-dimensional, and not one-dimensional as in the case of a guitar string, the physical position of a short circuit will influence a countless number of different resonance modes moving in different directions in the three-dimensional structure. By determining which resonance mode gives the best radiation at the desired frequency, therefore, the entire surrounding electromagnetic and dielectric structure can be employed to achieve a satisfactory radiation. Since the electromagnetic conditions may also vary with time, the measurement of the structure's resonance and search for resonance modes is an almost continuous process, which is repeated by the controller at sufficiently short intervals to enable one to judge that the electromagnetic conditions are constant between the intervals.

Thus the present invention provides techniques for exploiting the resonance characteristics of the surrounding metallic structure in the external apparatus, and for influencing the resulting, total resonance characteristics. The surrounding metallic structure is therefore employed as an antenna element instead of the antenna element being composed of the SIM card alone. This enables the antenna system on the SIM card to be made exceedingly compact, since it does not need to be resonant in itself. Instead, the resonance characteristics are exploited of the surrounding metallic structure in the apparatus in which the card is inserted.

Further objects and advantages of the invention will be evident from the following description with drawings.

BRIEF DESCRIPTION OF THE DRAWINGS

The invention will now be described in greater detail in the form of preferred embodiments with reference to the drawings, in which FIG. 3 illustrates an example of an SIM card with an antenna intended for 802.11b/g modulation, FIG. 4 illustrates the result of the electromagnetic simulation of an SIM card placed in a simplified electromagnetic model of a Siemens SX1 mobile telephone as an example.

DETAILED DESCRIPTION OF PREFERRED EMBODIMENTS

Figure 1:
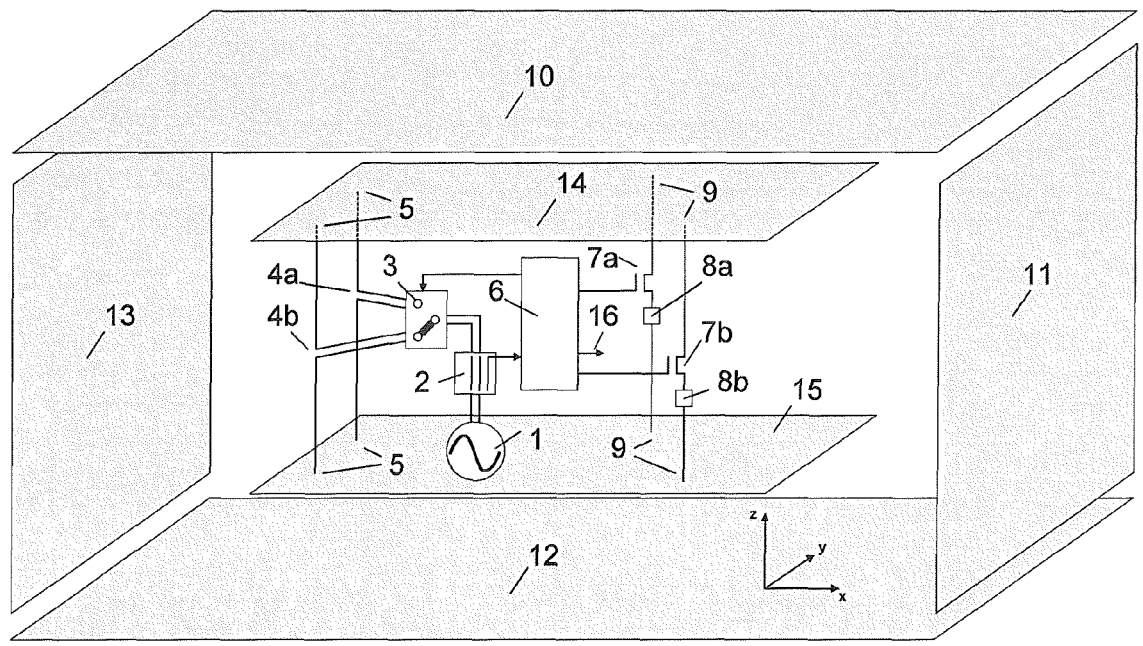
FIG. 1 illustrates a circuit board according to the invention, inserted in a metallic structure in an apparatus.

FIG. 1 illustrates the schematic construction of a circuit board according to the invention, particularly an SIM card, which is inserted in a metallic structure in an apparatus such as a mobile telephone. The circuit board and the surrounding structure are shown in perspective, substantially from the side.

It should be noted that FIG. 1 is schematic, and that there is therefore no intention of depicting realistic dimensions or size ratios. A real SIM card according to the invention will preferably be designed according to standard dimensions such as width 15 mm×length 25 mm×thickness 0.8 mm.

The SIM card comprises an electromagnetic coupler, including two electrically conductive structures 14, 15 mounted on opposite sides of the card. The SIM card further comprises an excitation controller 6, which is arranged to adapt resonance characteristics of the electromagnetic coupler depending on resonance characteristics of the apparatus.

In an embodiment each electrically conductive structure 14, 15 is a flat metallic layer, particularly of copper. In principle these may be of arbitrary shape, and as an example the layers may have substantially the same shape and surface area as the SIM card. The electromagnetic coupler 14, 15 interacts with the external metallic structure illustrated by 10, 11, 12, 13 in the apparatus.

A number of controllable electrical connections are mounted between points 9 on the first 14 and the second 15 conductive structures. In the example depicted, for illustrative reasons M=2 connections have been chosen. In a preferred embodiment the number may be in the range M=4 to N=12, particularly in the range M=6 to M=10, and specially preferred M=8. The controller 6 is arranged to adapt the electromagnetic coupler's resonance characteristics by supplying signal to/selection of these controllable electrical connections.

Each controllable, electrical connection comprises a predetermined impedance 8a, 8b in series with an electronically controlled switch 7a, 7b. For example, the predetermined impedances 8a, 8b may be substantially zero, whereby the switch 7a, 7b can activate an approximate short circuit between the points concerned on the first 14 and second 15 conductive structures. In another example the impedance may be a reactance element.

The SIM card further comprises a measuring device or a reflection meter 2 for measuring reflected output from the electromagnetic coupler. The controller 6 is arranged to supplying a signal to the controllable electrical connections depending on the measured reflected output from the electromagnetic coupler.

The reflection meter 2 may be implemented by measuring the standing wave ratio along a transmission line—so-called VSWR measurement (Voltage Standing Wave Ratio). Another realisation of the reflection meter is to implement measuring points in the actual output stage in the signal generator 1, since the operating point of the output transistor(s) reflects how much of the output is reflected back to the transmitter stage. The operating point's parameters may be voltage across the output transistors, current drawn in the output transistors, build-up of capacitance/reactance in the transistors and temperatures in the transistors. It is also expedient to measure the temperature differences in semiconductor transitions or between transistors in order to compensate for absolute temperature. The operating point's parameters are indicators of how the output stage operates. To compensate for temperature drift and production variation, an internal reference termination may be connected, this being used to establish a signature on the operating point in the output stage for an optimal situation, whereupon deviations therefrom can be measured and considered as results of misadjustment of the load that is connected to the output stage. The advantage of such an implementation is that it does not involve microwave components, and the parameters can be monitored by means of analog-to-digital converters which are inexpensive and easy to implement in an ASIC implementation (Application Specific Integrated Circuit).

The SIM card further comprises a signal source 1 and a number N of feed networks. In a preferred embodiment the number N will be of the order of 1 to 4. In the example the use is specially preferred of N=2 feed networks 4a, 4b. Each of these is arranged to controllably connect the signal source's 1 output to points 5 on the first 14 and/or the second 15 conductive structures.

The controller 6 is further arranged to supply signals to the feed networks in such a manner that the signal from the signal source 1 is passed to points 5 which are selected by the controller depending on the measured, reflected output from the electromagnetic coupler 14, 15. By means of the choice of feed network or combinations of feed networks the excitation controller 6 can control the feed networks' impedance in $2^N-1$ different combinations, where N is the number of feed networks, together with polarisation direction of the E-field in the excitation. At least one feed network must be employed in order to have the output disconnected in the metallic structure. The signal source 1 is preferably comprised of a transceiver, which is arranged to operate as a transmitter in transmission intervals and as a receiver in intervals between the transmission intervals, in order thereby to permit two-way communication.

The signal source or the transceiver emits radio signals on the desired frequency band with the desired modulation and protocol. The output signal is connected to a reflection meter 2. The output passes through this reflection meter and on to a controllable selector 3 which selects which feed network is to be used, 4a or 4b in the example.

The excitation controller 6 is arranged to control the M electronically controlled switches 7a and 7b as realised in a transistor that establishes controllable connections between the metallic structures 14 and 15 through the impedances 8a and 8b and the connection points 9, which may be arbitrarily located on the metallic structures 14 and 15. The impedances 8a and 8b may assume the values from 0 Ω to an arbitrary, complex impedance. For example, the impedances 8a, 8b may be essentially 0 Ω. The excitation controller 6 can therefore control the parasite impedance and different resonance modes for the metallic structure through activating $2^M$ different combinations where M is the number of controllable reactance/resonance elements that can be activated. The excitation of the electromagnetic coupler is implemented through the arbitrarily shaped metallic structures 14 and 15, which can either excite an E-field in the z-direction as indicated or in an arbitrary direction based on the combination of the feed networks 4a and 4b selected by the excitation controller, and this leads to the generation of currents and voltages in the surrounding structure 10, 11, 12 and 13, illustrating the arbitrary surrounding metallic structure of the external apparatus (for example the mobile telephone). This structure and the characteristics thereof are ascribed to the external apparatus, and possibly also the surroundings of the apparatus. The metallic structure may be completely or partly surrounding, but as long as it is not a complete Faraday cage, there will be resonance frequencies established by current and voltages induced in the structure. By the choice of which feed network is to be employed and which controllable impedance combination of connection points are to be activated, the resonance frequency can be influenced in the surrounding structure. The excitation controller measures the reflected output, and seeks the combination $(2^N-1) \times 2^M$ that gives minimum reflected output. In practice efforts are made to minimise N and M for reasons of cost, and in a practical circuit it may be sufficient to have a digital detector that emits a logic zero signal if the reflected output is less than 50%, and a logic unit signal if the reflected output is larger. Thus in a practical implementation attempts will be made to find a combination that introduces less than a given threshold, for example at 3 dB loss. In a transmission situation where the fading margin during propagation of waves in reflecting surroundings is 10-20 dB, the effect of the excitation loss is therefore acceptable. The threshold value is optional, and a balance between cost, the complexity of the adaptive network and the measuring time in order to find the optimal resonance mode for the desired frequency.

The controller 6 is further arranged to generate an output signal that indicates that the resonance characteristics of the apparatus are changed beyond a predetermined limit, in order thereby to permit detection that the apparatus is being touched, that the apparatus is set in motion or influenced by other external factors. Since the excitation controller 6 almost continuously measures the electromagnetic resonance characteristics of the surrounding structure, it will also easily be able to measure when these characteristics are changed quickly, for example by placing a hand on the mobile telephone. Such changes or special electromagnetic signatures can be intercepted and recognized by the system, thus enabling different output or status signals 16 to be given from the excitation controller to any external circuits which may have a use for this. Indications of movement, whether the telephone is touched or held in the hand, can give useful system information for different applications. This electromagnetic resonance analysis may also be used for identifying objects that have a predefined resonance in the form of an electromagnetic signature. This signature can be made of cost-effective printed metal patterns and used for marking, and therefore a number of different signature codes can be read out when this metal pattern comes so close to the apparatus that it influences the electromagnetic resonances in the system.

Figure 2:
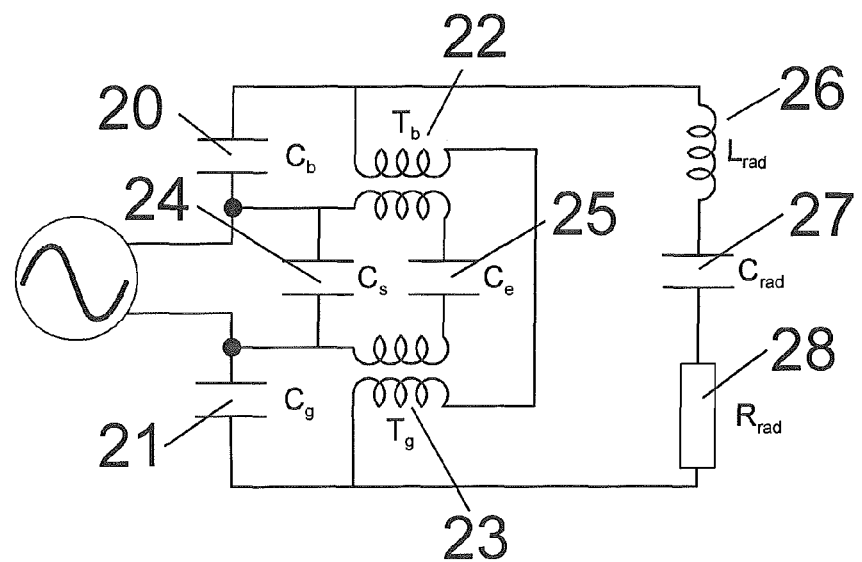
FIG. 2 illustrates a simplified electrical model of the complete antenna structure consisting of the circuit board and the surrounding metallic structure.

FIG. 2 illustrates a simplified electrical model of the total antenna structure which consists of the adaptive antenna system in the SIM card together with the surrounding metallic structure in the mobile telephone. The signal source 1 or the combined transmitter/receiver establishes a voltage between the metallic structures in the SIM card, which is modelled as a capacitance between the plates 24 and a combined reactance represented by 22, 23 and 25. If the substrate selected between the two planar metallic structures on the SIM card, the capacitance 24 becomes relatively large, up to 150 pF or more if the substrate is 0.1 mm thick and has a relative dielectric constant of 3-5. This may be an undesirably high capacitance at microwave frequencies such as 2.45 GHz or higher, but it also makes a positive contribution by being connected to the total resonance circuit, thereby reducing the lowest resonance frequency for the total metallic structure. When the SIM card is placed immediately above a metallic structure or back panel down in the battery well of the mobile telephone, a capacitive coupling 21 to this back panel is produced. Some mobile telephones do not have such a metallic back panel, but all mobile telephones have a circuit board on which the components are mounted. In this circuit board is a ground plane which then acts in a similar manner, but if the distance to this ground plane becomes greater, the value of the capacitive coupling 21 is reduced. After the SIM card is placed in the mobile telephone, the battery is placed on top, and the metal jacket round the battery remains close to and on top of the SIM card, and a capacitive coupling 20 is produced between the metallic structures in the SIM card and the battery. In addition to the capacitive coupling, inductive couplings are produced between the SIM card and the back panel 23, and between the SIM card and the battery 22, since currents pass through the metallic structures establishing magnetic fields between them. In other configurations of the surrounding metallic structure there may be established other combinations of capacitive and inductive coupling. It will also be dependent on which feed network 4a and 4b or possibly the N feed networks available. Depending on the shape of the metallic structures in the SIM card and which combination of the M controllable switches are chosen, a resulting resonance circuit is produced represented by 22, 23 and 25. The surrounding metallic structure is represented here by a single resonance at 26 and 27 together with the radiation resistance 28.

FIG. 3 illustrates an example of an SIM card with an antenna intended for 802.11 b/g modulation, where the card has two planar metallic structures 36 and 37 on each side of the SIM card. These metallic structures are excited by a feed point 32 with two supply lines—one for each layer. In addition there is a controllable short circuit 34 that can be placed at different points along the axis 35. In a practical implementation this comprises different short-circuiting switches that can be activated from a controller. A full electromagnetic simulation of a simplified electromagnetic model of a Siemens SX1 mobile telephone has been conducted, where the SIM card is placed inside a surrounding metallic structure consisting of a metal plate behind the SIM card and a battery in front of the SIM card illustrated in FIG. 4.

FIG. 4 illustrates the result of the electromagnetic simulation of an SIM card as illustrated in FIG. 3 inserted in a simplified electromagnetic model of a Siemens SX1 mobile telephone as an example. The different resonance curves are the result of different positioning of a short circuit through the two metallic structures in the realisation of the SIM card as illustrated in FIG. 3. It is evident that in the range 2.0389 GHz to 2.495 GHz, by activating different short circuits through the metallic structure, it is possible to establish resonance of the surrounding metallic structure, thus enabling an acceptable radiation of electromagnetic output to be implemented. In practice, the actual metallic structure will be far more complex, and it will also result in far more resonance points. In a real implementation the greater number of resonance points, together with the effect of different short circuits, will therefore give an even greater probability of achieving a useful resonance of the surrounding metallic structure at the desired frequency.

Figure 5:
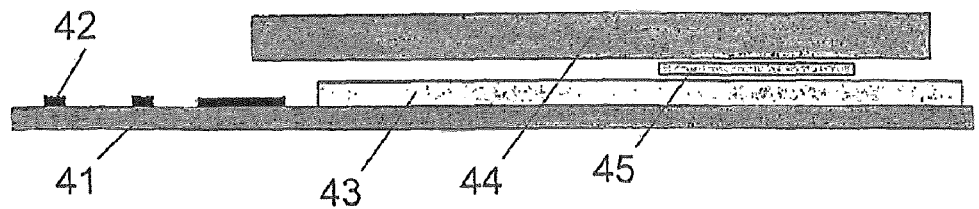
FIG. 5 illustrates an example of a typical configuration where an SIM card is placed inside a mobile telephone.

FIG. 5 illustrates an example of a typical configuration where an SIM card 45 is placed immediately on top of a metallic back panel 43 in the mobile telephone. Under the metallic back panel 43 is a circuit board 41 on which the electronic components 42 of the mobile telephone are mounted. The circuit board 41 contains a ground plane which covers the whole board and is recessed in the board's inner layer. When the SIM card is placed on the metallic back panel 43, the battery 44 is then mounted so that it is placed right on top of the SIM card. The battery 44 contains a Lithium Ion battery where the chemicals are encapsulated in a hermetically sealed metal can.

Figure 6:
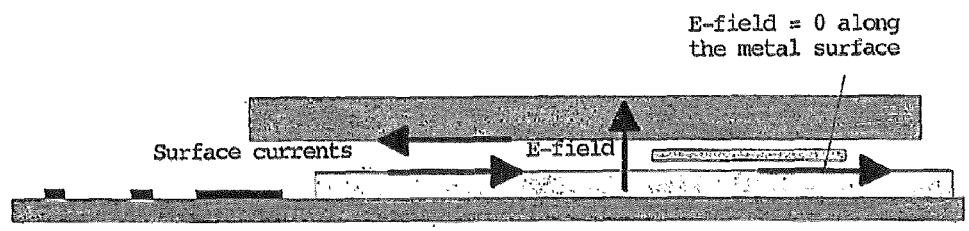
FIG. 6 illustrates an example of the electromagnetic configuration that is established by the antenna structure in the SIM card when it is placed inside a mobile telephone.

FIG. 6 illustrates an example of the electromagnetic configuration established by the antenna structure in the SIM card. In this structure the E-field is short-circuited by the metallic structures located above and below the SIM card, and excitation of the E-field in the horizontal direction is therefore not a practical solution. However, currents can be induced along these metallic structures, and an E-field can be established in the vertical direction as illustrated in the figure. By controlling the different resonance modes and both influencing and selecting the correct resonance modes, the resulting antenna structure can be a highly efficient structure for electromagnetic radiation.

Figure 7:
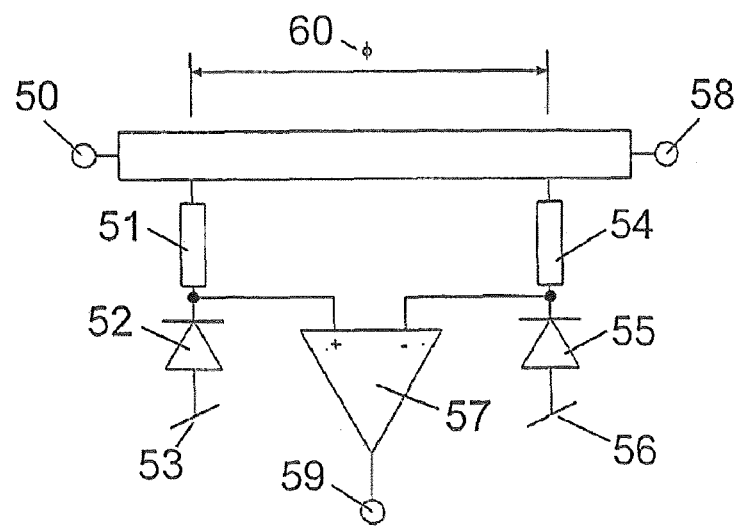
FIG. 7 illustrates an implementation of the reflection meter in its simplest form.

FIG. 7 illustrates a realisation of the reflection meter in its simplest form. The input signal is connected to the terminal 50, led through the transmission line 61 which has an electrical length 60, $\phi$, which is typically between 0.1 and 0.2 wavelengths on the frequency concerned. Two start-up resistors 51 and 54 are connected to the transmission line. These are high-value resistors, with the result that the rectifier diodes on RF frequency 52 and 55 do not introduce load to the line or cause undesirable intermodulation for the output signal. The two condensers 62 and 63 arrange for the production of a resulting direct voltage referred to earth 53, reflecting the amplitude of the different points, and this is led into an operational amplifier 57 which augments the difference between the two inputs. If there are not reflections of the signal, the voltages across the two diodes 52 and 55 will be equal. If there are reflections, standing waves are produced on the transmission line, and the voltages across the two diodes 52 and 55 will be different, apart from cases where symmetrical measurements are made on each side of the maximum points of standing waves along the transmission line. Thus it is necessary to change the transmitter frequency in order to also be able to detect this type of standing wave ratio.

The above detailed description is presented for illustrative purposes. Those skilled in the art will realise that many variations and alternatives exist within the scope of the invention, as will be evident from the following patent claims and their equivalents.

For example, the circuit board may comprise two metallic structures connected to respective feed networks 4a and 4b, and a separate, two-part metallic structure for connection of the respective controllable switches 7a and 7b. This may also be split up into several separate two-part metallic structures—up to N two-part metallic structures for the feed networks and M two-part metallic structures for the controllable switches. The switches may also include variants with more than two states, i.e. impedance and reactance in the switches can be controlled analogously in order to be able to control the impedance in the switch analogously instead of controlling it in two discrete stages. Other alternatives comprise the use of purely inductive couplers 22 or 23, where the capacitive connections are zero—i.e. the condensers 20 and 21 have the value zero. This may be implemented by a wire with a length between the connection points, which then acts as a purely inductive coupler 22 and 23 between the circuit board and the electromagnetic structure in the surrounding apparatus. In some embodiments one inductive coupler 22 may also suffice between the circuit board and the surrounding electromagnetic structure.

The invention claimed is:

1. A SIM circuit board for mounting in a mobile communication apparatus, comprising an electromagnetic coupler, including a first and a second electrically conductive structure, where a number of controllable electrical connections are mounted between points on the first and the second conductive structure, and a controller arranged to adapt resonance characteristics of the electromagnetic coupler depending on resonance characteristics of the apparatus by supplying a signal to said controllable electrical connections, wherein said first and second conductive structures are arranged on opposite sides of the circuit board, thus enabling an E-field to be established with a direction perpendicular to the circuit board's main surface.

2. A SIM circuit board according to claim 1, where the controllable electrical connections each comprise a predetermined impedance in series with an electronically controlled switch.

3. A SIM circuit board according to claim 1, further comprising a measuring device for measuring reflected output from the electromagnetic coupler, where the controller is arranged to supply signals to the controllable electrical connections depending on the measured reflected output from the electromagnetic coupler.

4. A SIM circuit board according to claim 1, further comprising a signal source and a number of feed networks, each of which is arranged to controllably connect the signal source's output to points-on the first and the second conductive structure.

5. A SIM circuit board according to claim 4, where the controller is further arranged to supply signal to at least one feed network so that the signal from the signal source is led to points selected depending on the measured reflected output from the electromagnetic coupler.

6. A SIM circuit board according to claim 5, where the signal source is comprised of a transceiver, arranged to operate as a transmitter in transmission intervals and which receives in intervals between the transmission intervals, in order thereby to permit two-way communication.

7. A SIM circuit board according to claim 1, where the controller is further arranged to generate an output signal indicating that the resonance characteristics of the apparatus are altered beyond a predetermined limit, in order thereby to permit detection that the apparatus is being touched, that the apparatus is set in motion or influenced by other external factors.

8. A SIM circuit board according to claim 1, where the E-field is established by inducing electric surface currents along metallic structures located on the top and bottom of the circuit board when the SIM circuit board is mounted in the mobile communication apparatus.

9. A SIM circuit board according to claim 1, wherein the first and the second conductive structures are flat metallic layers which correspond to the circuit board's surface area.

10. A SIM circuit board according to claim 1, wherein the controllable electrical connections each comprise an impedance approximately equal to zero, in series with an electronically controlled switch.

11. A SIM circuit board according to claim 1, wherein the number of controllable electrical connections is in the range 4 to 12.

12. A SIM circuit board according to claim 11, wherein the number of controllable electrical connections is in the range 6 to 10.

13. A SIM circuit board according to claim 12, wherein the number of controllable electrical connections is 8.

14. A SIM circuit board according to claim 1, wherein the number of feed networks is 2.

15. A SIM circuit board according to claim 1, designed according to standard physical dimensions for a SIM card.

16. A SIM circuit board according to claim 1, having a maximum width of 15 mm, a maximum length of 25 mm and a maximum thickness of 0.8 mm.

17. A SIM circuit board according to claim 1, having a width of 15 mm, a length of 25 mm and a thickness of 0.8 mm.

18. A SIM circuit board according to claim 1, wherein said first and second conductive structures are flat metallic layers.

19. A SIM circuit board according to claim 18, wherein said flat metallic layers have substantially the same shape and surface area as the SIM circuit board.

20. A SIM circuit board for mounting in a mobile communication apparatus, comprising
an electromagnetic coupler, including a first and a second electrically conductive structure, where a number of controllable electrical connections, each including a predetermined impedance in series with an electronically controlled switch, are mounted between points on the first and the second-conductive structure, and
a controller arranged to adapt resonance characteristics of the electromagnetic coupler depending on resonance characteristics of the apparatus by supplying a signal to said controllable electrical connections,
wherein said first and second-conductive structures are arranged on opposite sides of the circuit board, thus enabling an E-field to be established with a direction perpendicular to the circuit board's main surface by inducing electric surface currents along metallic structures located on the top and bottom of the circuit board when the SIM circuit board is mounted in the mobile communication apparatus.

21. A SIM circuit board according to claim 20, wherein said predetermined impedance is zero.

22. A mobile communication apparatus, comprising a SIM circuit board, and metallic structures located on the top and bottom of the circuit board when the circuit board is mounted in the mobile communication apparatus, the circuit board comprising an electromagnetic coupler, including a first and a second electrically conductive structure, where a number of controllable electrical connections, each including an impedance approximately equal to zero in series with an electronically controlled switch, are mounted between points on the first and the second conductive structure, and
a controller arranged to adapt resonance characteristics of the electromagnetic coupler depending on resonance characteristics of the apparatus by supplying a signal to said controllable electrical connections,
wherein said first and second-conductive structures are arranged on opposite sides of the circuit board, thus enabling an E-field to be established with a direction perpendicular to the circuit board's main surface by inducing electric surface currents along said metallic structures.

23. A mobile communication apparatus according to claim 22, wherein said predetermined impedance is substantially zero.

24. A mobile communication apparatus according to claim 22, wherein said metallic structures comprises a metallic back panel in the mobile communication apparatus and a battery metal can in the mobile communication apparatus.

* * * * *